(12) United States Patent
Muramatsu et al.

(10) Patent No.: US 11,094,547 B2
(45) Date of Patent: Aug. 17, 2021

(54) METHOD FOR PRODUCING WIRING STRUCTURE

(71) Applicant: HAMAMATSU PHOTONICS K.K., Hamamatsu (JP)

(72) Inventors: Masaharu Muramatsu, Hamamatsu (JP); Hisanori Suzuki, Hamamatsu (JP); Yasuhito Yoneta, Hamamatsu (JP); Shinya Otsuka, Hamamatsu (JP); Hirotaka Takahashi, Hamamatsu (JP)

(73) Assignee: HAMAMATSU PHOTONICS K.K., Hamamtsu (JP)

( * ) Notice: Subject to any disclaimer, the term of this patent is extended or adjusted under 35 U.S.C. 154(b) by 0 days.

(21) Appl. No.: 15/765,528

(22) PCT Filed: Sep. 1, 2016

(86) PCT No.: PCT/JP2016/075680
§ 371 (c)(1),
(2) Date: Apr. 3, 2018

(87) PCT Pub. No.: WO2017/061193
PCT Pub. Date: Apr. 13, 2017

(65) Prior Publication Data
US 2019/0080912 A1 Mar. 14, 2019

(30) Foreign Application Priority Data
Oct. 5, 2015 (JP) .............................. JP2015-197522

(51) Int. Cl.
*H01L 21/288* (2006.01)
*C23C 18/18* (2006.01)
(Continued)

(52) U.S. Cl.
CPC ............ *H01L 21/288* (2013.01); *C23C 18/16* (2013.01); *C23C 18/18* (2013.01);
(Continued)

(58) Field of Classification Search
CPC ........................ H01L 27/3288; H01L 27/3297
See application file for complete search history.

(56) References Cited

U.S. PATENT DOCUMENTS 5,116,589 A * 5/1992 Hoenig ............... C04B 35/6455
264/102
5,842,387 A * 12/1998 Marcus ................... B23P 15/40
76/104.1
(Continued)

FOREIGN PATENT DOCUMENTS

JP 2007-113092 A 5/2007
JP 2008-115448 A 5/2008
(Continued)

OTHER PUBLICATIONS

International Preliminary Report on Patentability dated Apr. 19, 2018 for PCT/JP2016/075680.

*Primary Examiner* — Mohammad M Choudhry
(74) *Attorney, Agent, or Firm* — Faegre Drinker Biddle & Reath LLP

(57) ABSTRACT

Provided is a method for producing a wiring structural body provided with a wiring pattern, the method including a first step of forming an insulating layer on a surface of a silicon substrate along at least a region for forming the wiring
(Continued)

pattern, a second step of forming a boron layer on the insulating layer along the region, and a third step of forming a metal layer on the boron layer by plating.

4 Claims, 9 Drawing Sheets

(51) Int. Cl.
| | |
|---|---|
| *H01L 23/14* | (2006.01) |
| *C23C 18/16* | (2006.01) |
| *H01L 23/12* | (2006.01) |
| *H01L 23/498* | (2006.01) |
| *H01L 21/768* | (2006.01) |
| *H01L 21/48* | (2006.01) |
| *H01L 21/3205* | (2006.01) |
| *H01L 23/522* | (2006.01) |

(52) U.S. Cl.
CPC ........ *H01L 21/3205* (2013.01); *H01L 21/486* (2013.01); *H01L 21/76874* (2013.01); *H01L 21/76898* (2013.01); *H01L 23/12* (2013.01); *H01L 23/14* (2013.01); *H01L 23/147* (2013.01); *H01L 23/49805* (2013.01); *H01L 23/49827* (2013.01); *H01L 23/49866* (2013.01); *H01L 23/522* (2013.01)

(56) References Cited

U.S. PATENT DOCUMENTS

| | | | |
|---|---|---|---|
| 2002/0048938 | A1 | 4/2002 | Ishizuka et al. |
| 2003/0186543 | A1* | 10/2003 | Jiang .................. H01L 21/76831 |
| | | | 438/687 |
| 2003/0235991 | A1 | 12/2003 | Schulte et al. |
| 2004/0207049 | A1 | 10/2004 | Bauer et al. |
| 2004/0259353 | A1 | 12/2004 | Engbrecht et al. |
| 2009/0014877 | A1* | 1/2009 | Chang ............... H01L 21/76834 |
| | | | 257/751 |
| 2010/0276572 | A1* | 11/2010 | Iwabuchi ............... H01L 23/481 |
| | | | 250/208.1 |
| 2013/0075742 | A1* | 3/2013 | Ohsawa ............ H01L 27/11582 |
| | | | 257/66 |
| 2015/0056803 | A1 | 2/2015 | Chandrashekar et al. |

FOREIGN PATENT DOCUMENTS

| | | |
|---|---|---|
| JP | 2012-77342 A | 4/2012 |
| JP | 2012-119381 A | 6/2012 |

* cited by examiner

METHOD FOR PRODUCING WIRING STRUCTURE

TECHNICAL FIELD

The present disclosure relates to a method for producing a wiring structural body provided with a wiring pattern.

BACKGROUND ART

There is known a semiconductor device including a silicon substrate having a wiring pattern arranged on a surface thereof, an insulating layer provided on the surface of the silicon substrate along the wiring pattern, and a metal layer provided on the insulating layer (refer to, for example, Patent Literature 1).

CITATION LIST

Patent Literature

Patent Literature 1: Japanese Unexamined Patent Publication No. 2012-119381

SUMMARY OF INVENTION

Technical Problem

In a wiring structural body provided with a wiring pattern like the above-described semiconductor device, miniaturization of the wiring pattern is required for downsizing, high integration, and the like. On the other hand, reliability of electrical connection in the wiring pattern is also required.

An object of an aspect of the present disclosure is to provide a method for producing a wiring structural body capable of achieving both miniaturization of a wiring pattern and reliability of electrical connection in the wiring pattern.

Solution to Problem

According to an aspect of the present disclosure, there is provided a method for producing a wiring structural body provided with a wiring pattern, the method including a first step of forming an insulating layer on a surface of a silicon substrate along at least a region for forming the wiring pattern, a second step of forming a boron layer on the insulating layer along the region, and a third step of forming a metal layer on the boron layer by plating.

In the method for producing the wiring structural body, the boron layer is formed on the insulating layer along the region for forming the wiring pattern, and after that, the metal layer is formed on the boron layer by plating. This configuration is based on the findings that the present inventors have found that the metal layer is selectively and isotropically formed on the boron layer by plating. Therefore, by forming the boron layer accurately by, for example, patterning, a fine wiring pattern can be formed. In addition, in the method for producing the wiring structural body, the metal layer is formed on the boron layer. This configuration is based on the findings that the present inventors have found that the metal layer is stably formed on the boron layer. Therefore, reliability of electrical connection in the wiring pattern can be achieved. Accordingly, in the method for producing the wiring structural body, it is possible to achieve both miniaturization of the wiring pattern and reliability of electrical connection in the wiring pattern.

In the method for producing the wiring structural body according to an aspect of the present disclosure, in the second step, the boron layer may be isotropically formed on the insulating layer by a vapor deposition, and after that, the boron layer may be patterned along the region. According to this configuration, it is possible to accurately and easily form the boron layer along the region.

In the method for producing the wiring structural body according to an aspect of the present disclosure, in the third step, a nickel layer may be formed on the boron layer by plating. According to this configuration, because the nickel layer is easily adhered to the boron layer, it is possible to reliably and easily form the nickel layer on the boron layer.

Advantageous Effects of Invention

According to an aspect of the present disclosure, it is possible to provide a method for producing a wiring structural body capable of achieving both miniaturization of a wiring pattern and reliability of electrical connection in the wiring pattern.

DESCRIPTION OF EMBODIMENTS

Figure 1:
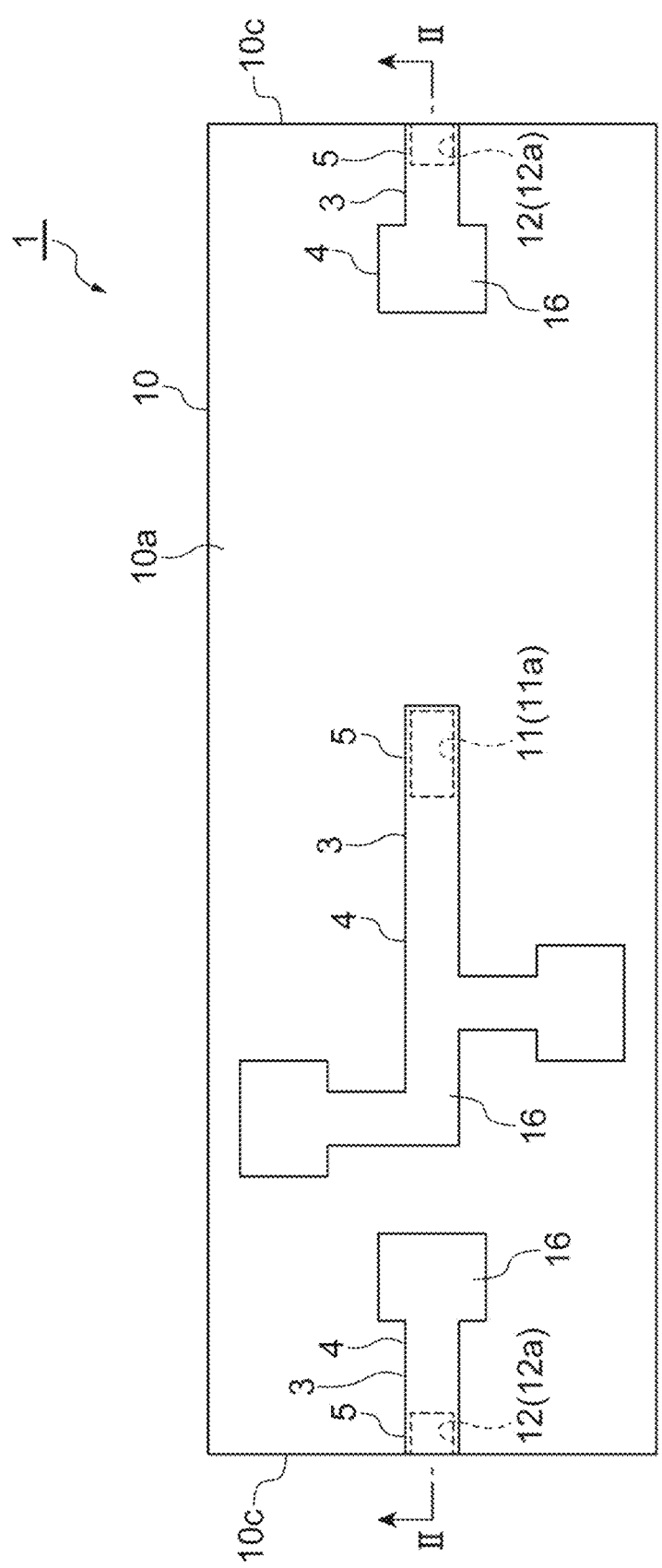
FIG. 1 is a plan view of an interposer which is a wiring structural body produced by a method for producing the wiring structural body according to an embodiment of the present disclosure.

Hereinafter, an embodiment of the present disclosure will be described in detail with reference to the drawings. In each figure, the same or corresponding components are denoted by the same reference numerals, and redundant description is omitted.

Figure 2:
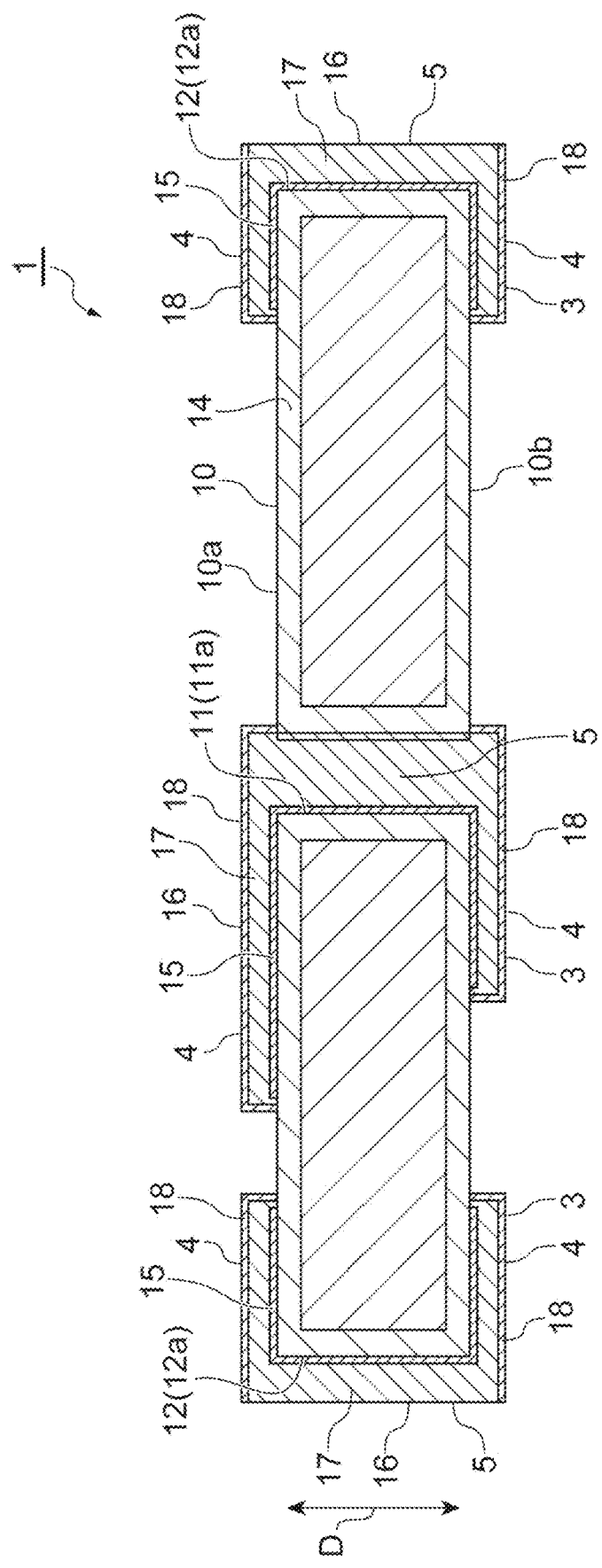
FIG. 2 is a cross-sectional view taken along line II-II of the interposer of FIG. 1.

An interposer (wiring structural body) 1 illustrated in FIGS. 1 and 2 is, for example, a relay substrate used for relaying electrical connection between electronic components having different terminal pitches. The interposer 1 includes a rectangular plate-shaped silicon substrate 10 made of a silicon (Si) crystal. A wiring pattern 3 having a predetermined shape is provided on the silicon substrate 10. The wiring pattern 3 includes a surface wiring pattern 4 provided along a first principal surface 10a and a second principal surface 10b of the silicon substrate 10 and a through-wiring pattern 5 connecting the surface wiring pattern 4 on the first principal surface 10a side and the surface wiring pattern 4 on the second principal surface 10b side. In FIGS. 1 and 2, the wiring pattern 3 is schematically illustrated in a simple shape, but actually, the wiring pattern 3 is formed accurately to have a complicated shape.

The silicon substrate 10 is provided with a through hole 11 penetrating the silicon substrate 10 and being opened to the first principal surface 10a and the second principal surface 10b of the silicon substrate 10. A through-wiring pattern 5 is disposed in the through hole 11. The through hole 11 has a quadrangular prism shape extending along a thickness direction D of the silicon substrate 10. A width of the through hole 11 is, for example, 10 μm or more and 100 μm or less. The width of the through hole 11 is a width in a direction perpendicular to a penetration direction, and herein, the width of the through hole is a distance between facing two sides. An inner surface 11a of the through hole 11 is entirely along the thickness direction D and intersects the first principal surface 10a and the second principal surface 10b at right angles.

FIGS. 1 and 2 also schematically illustrate the through hole 11 in a simple shape, but actually, a plurality of the through holes 11 are provided. For example, in addition to the vertical holes as described above, the through holes 11 having various shapes such as inclined holes of which penetration directions are inclined with respect to the thickness direction D and bent holes having bent portions may be provided. The inner surface 11a of the through hole 11 may have a portion along the thickness direction D as described above and a portion along the direction intersecting the thickness direction D and may have a tapered portion. Alternatively, the entire inner surface 11a may be formed to have a tapered shape.

In addition, at least a portion of the inner surface 11a of the through hole 11 may be along a direction intersecting the thickness direction D. For example, the entire inner surface 11a of the through hole 11 may be along the direction intersecting the thickness direction D (inclined hole). Alternatively, the through hole 11 may have a first portion where the inner surface 11a is along the first direction and a second portion where the inner surface 11a is along the second direction which intersects the first direction and the thickness direction D (bent hole).

In the silicon substrate 10, each of a pair of side surfaces 10c and 10c that face each other is provided with a depression 12. The depression 12 is formed by cutting a silicon wafer W (refer to FIG. 3) on which the through holes 11 are formed, along dicing lines L passing through the through holes 11 as described later. The depression 12 has a quadrangular prism shape that bisects the through hole 11 along a plane that passes through the center of the through hole 11 and is parallel to the side surface 10c.

In the silicon substrate 10, an insulating layer 14 is provided on the first principal surface 10a, the second principal surface 10b, the inner surface 11a of the through hole 11, and the inner surface 12a of the depression 12. The insulating layer 14 is, for example, a silicon oxide film formed by performing thermal oxidation treatment on the surface of the silicon substrate 10. The insulating layer 14 has a thickness of, for example, 1.0 μm or less.

A boron layer 15 is provided on the insulating layer 14. The boron layer 15 is formed along the wiring pattern 3. That is, the boron layer 15 is formed on the insulating layer 14 on the first principal surface 10a and the second principal surface 10b along the surface wiring pattern 4 and is formed on the insulating layer 14 on the inner surface 11a of the through hole 11 and the inner surface 12a of the depression 12 along the through-wiring pattern 5. In this example, the boron layer 15 is formed over the entire surface of the insulating layer 14 on the inner surface 11a and the inner surface 12a. The boron layer 15 formed on the insulating layer 14 on the inner surface 11a and the inner surface 12a is continuous with the boron layer 15 formed on the insulating layer 14 on the first principal surface 10a and the second principal surface 10b. The boron layer 15 is isotropically formed with a thickness of several nanometers to several tens of nanometers by a vapor deposition such as a chemical vapor deposition (CVD) epitaxial growth.

A metal layer 16 is formed on the boron layer 15. The metal layer 16 has a thickness of, for example, several micrometers to several tens of micrometers. The metal layer 16 is formed on the boron layer 15 on the first principal surface 10a and the second principal surface 10b along the surface wiring pattern 4 and is formed on the boron layer 15 on the inner surface 11a of the through hole 11 and the inner surface 12a of the depression 12 along the through-wiring pattern 5. In this example, the metal layer 16 is buried in the through hole 11 and filled in the through hole 11 without a gap.

The metal layer 16 is, for example, a plating layer isotropically formed on the boron layer 15 by plating. An example of plating, electroless metal plating may be exemplified. The metal layer 16 is configured by forming a gold layer 18 made of gold and having a thickness of about 0.05 μm on the nickel layer 17 made of nickel and having a thickness of about 5 μm or about 10 μm by, for example, electroless Ni/Au plating. As described above, because the depression 12 is formed by cutting the through hole 11, in the metal layer 16 in the depression 12, the gold layer 18 is not formed on the nickel layer 17, and the nickel layer 17 is exposed to the outer surface. In addition, it is the findings that the present inventors have found that the metal layer 16 is stably formed on the boron layer 15 and that the metal layer 16 is selectively and isotropically formed on the boron layer 15 by plating.

Next, a method for producing an interposer 1 will be described with reference to FIGS. 3 to 9(b). In addition, in FIGS. 4(a) to 9(b), FIGS. 4(a), 5(a), 6(a), 7(a), 8(a), and 9(a) are plan views, and FIGS. 4(b), 5(b), 6(b), 7(b), 8(b), and 9(b) are cross-sectional views taken along line B-B.

Figure 3:
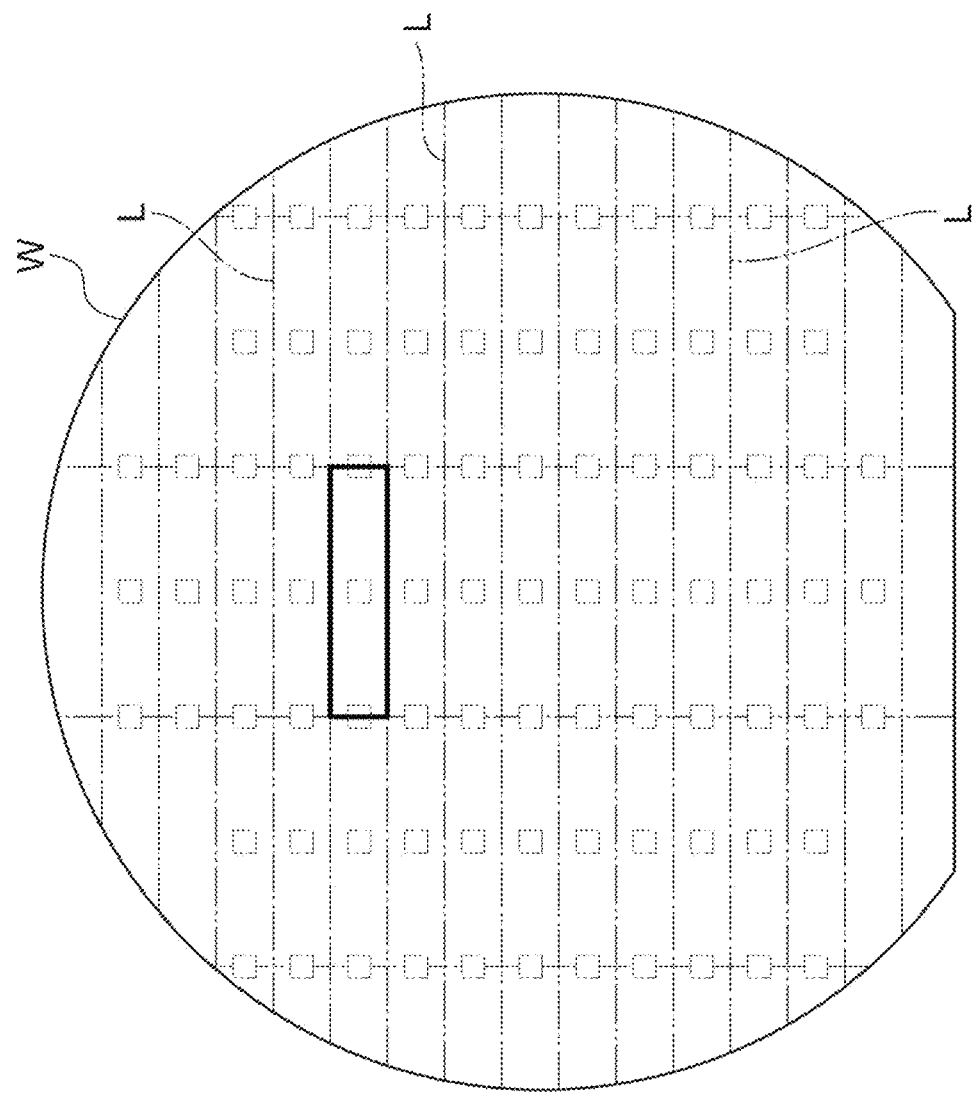
FIG. 3 is a view illustrating the method for producing the interposer of FIG. 1.
Figure 4:
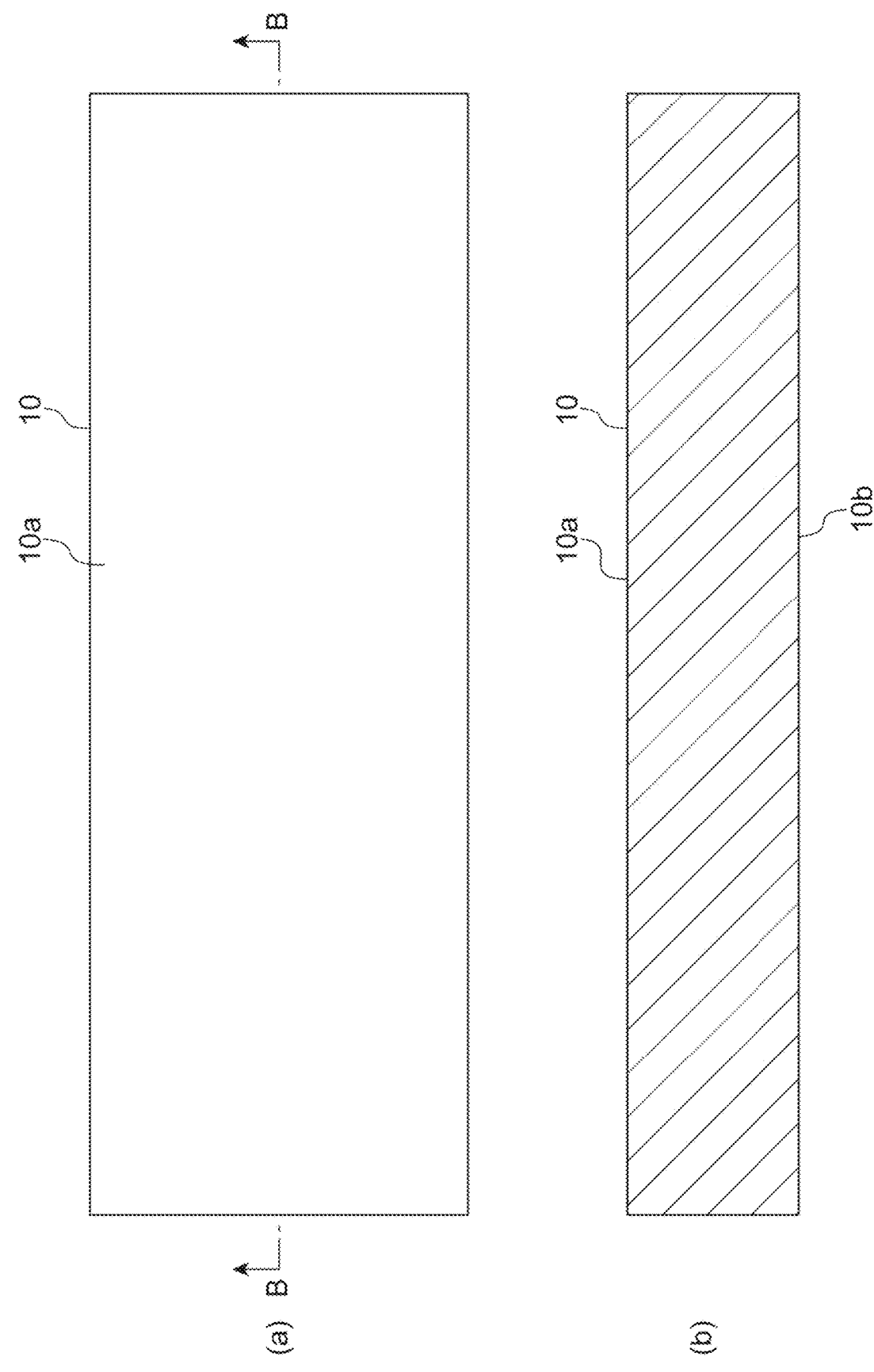
FIGS. 4(a) and 4(b) are views illustrating the method for producing the interposer of FIG. 1.
Figure 5:
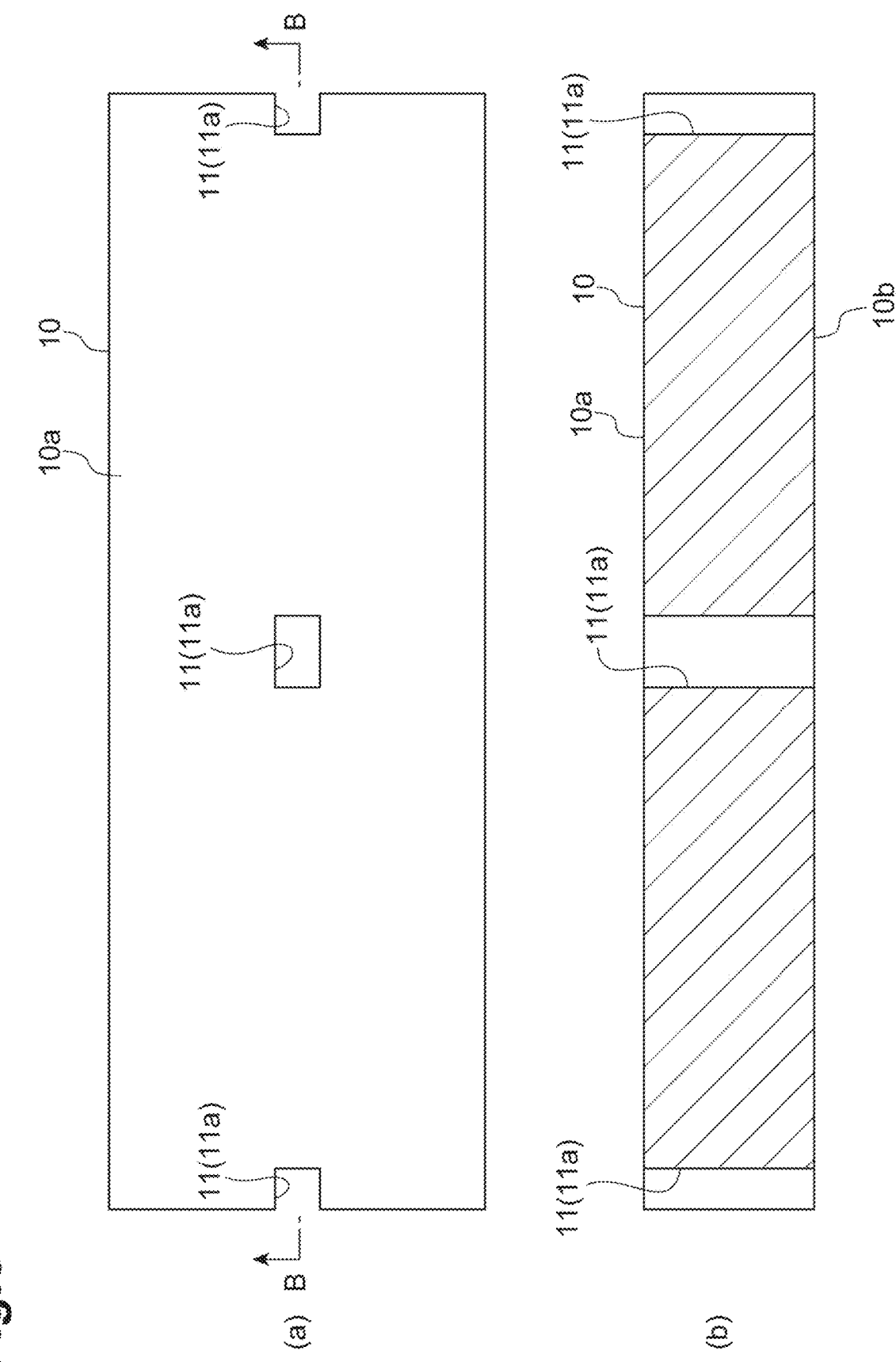
FIGS. 5(a) and 5(b) are views illustrating the method for producing the interposer of FIG. 1.
Figure 6:
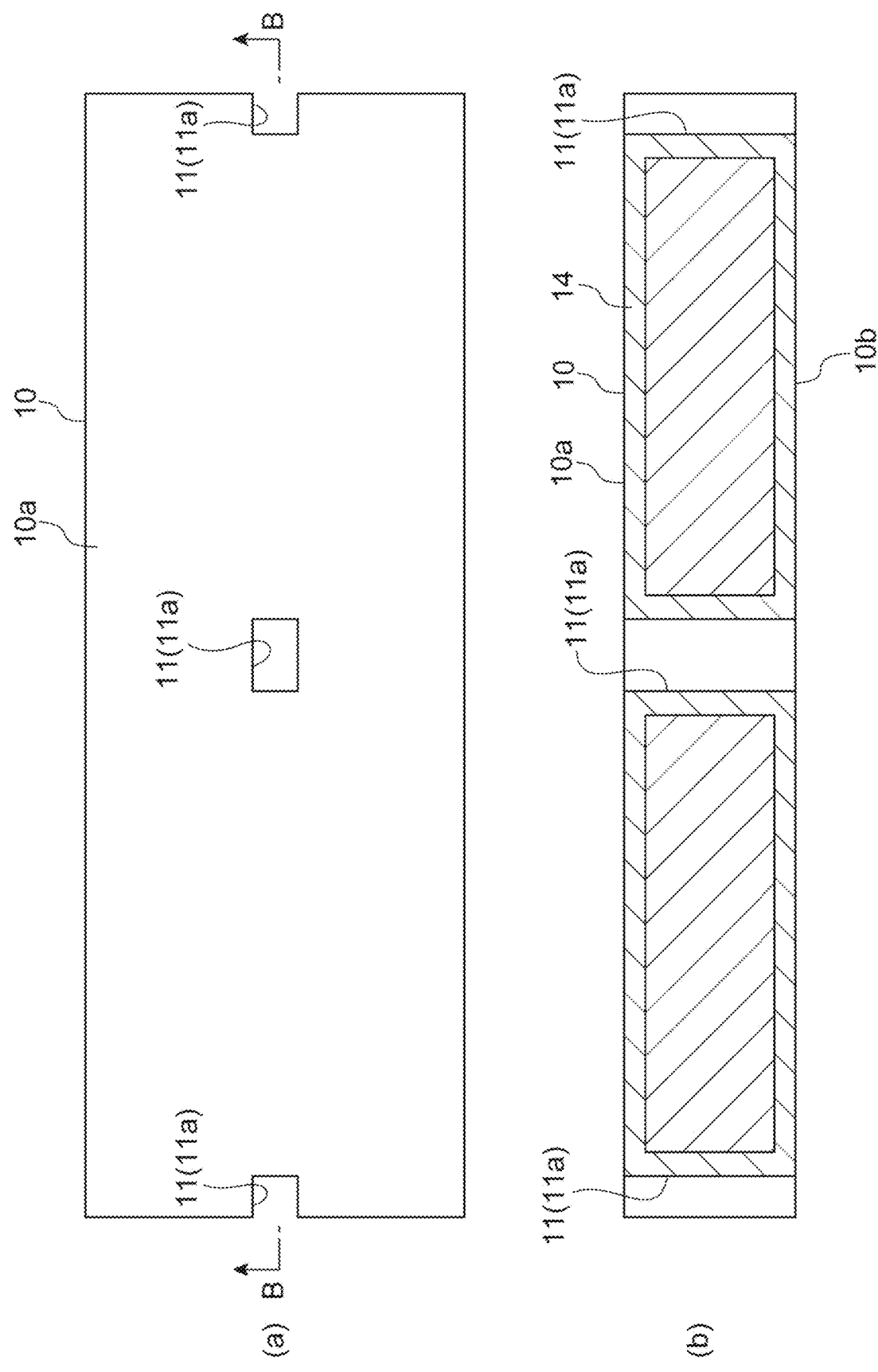
FIGS. 6(a) and 6(b) are views illustrating the method for producing the interposer of FIG. 1.
Figure 7:
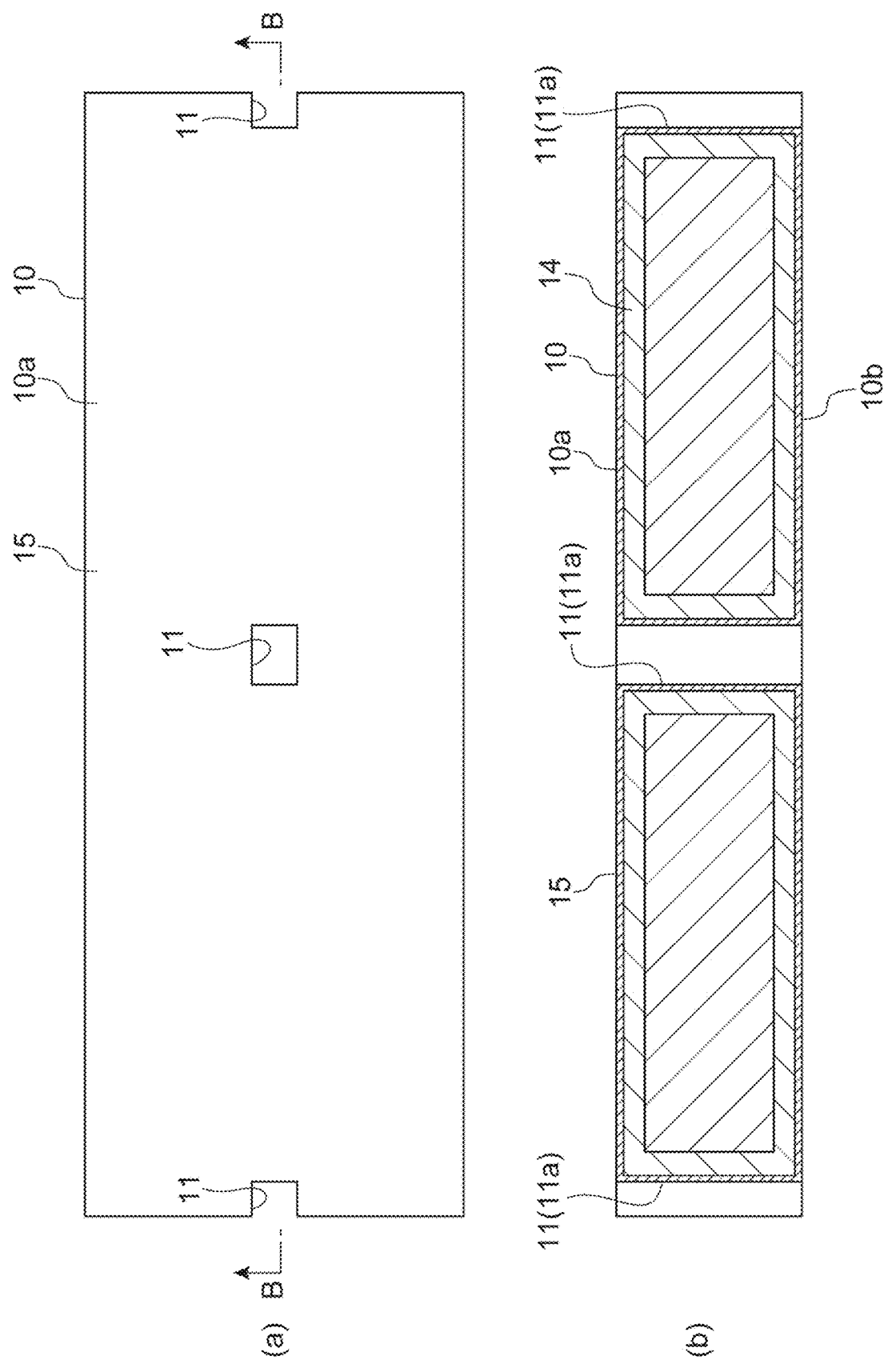
FIGS. 7(a) and 7(b) are views illustrating the method for producing the interposer of FIG. 1.
Figure 8:
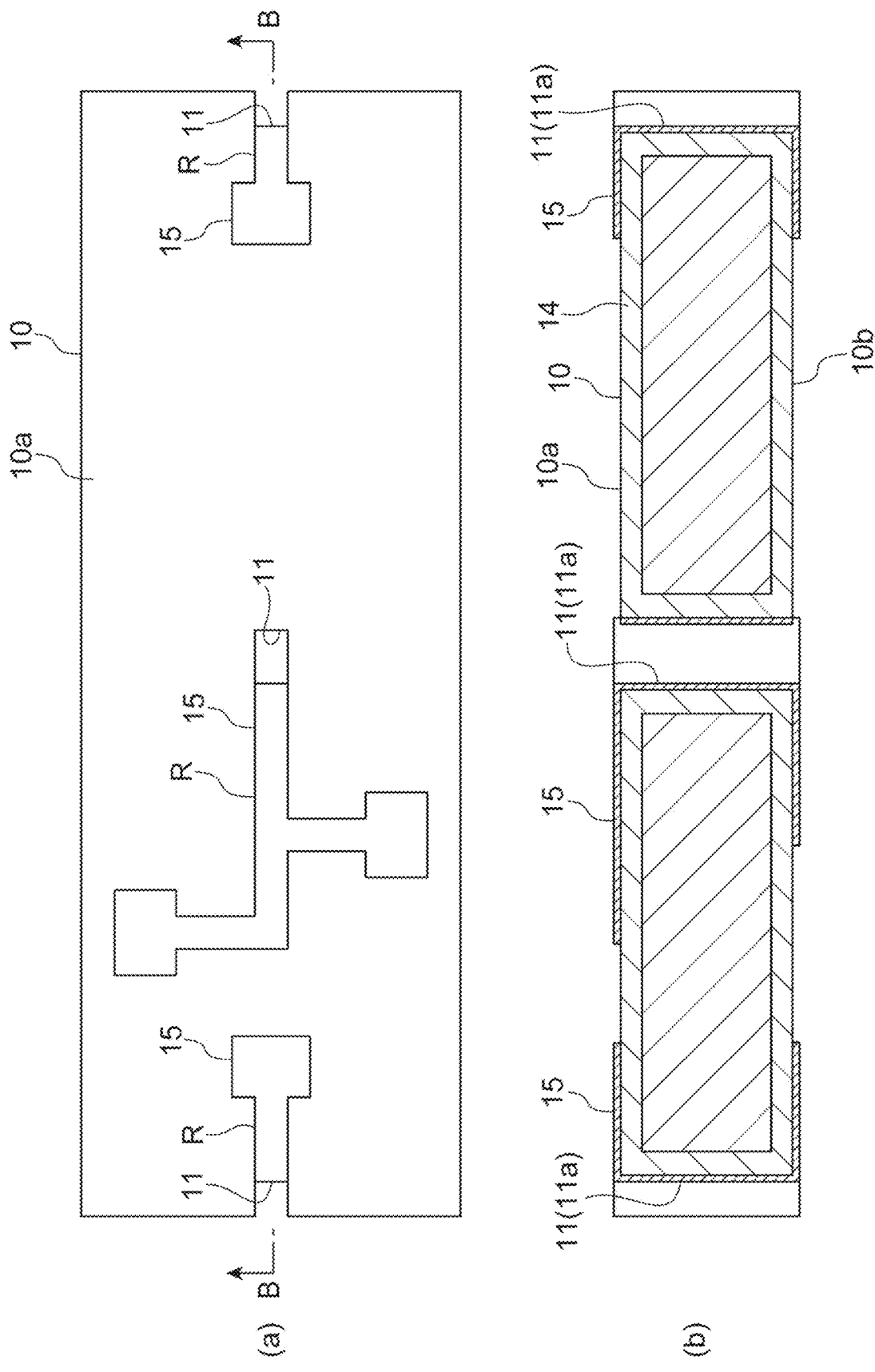
FIGS. 8(a) and 8(b) are views illustrating the method for producing the interposer of FIG. 1.
Figure 9:
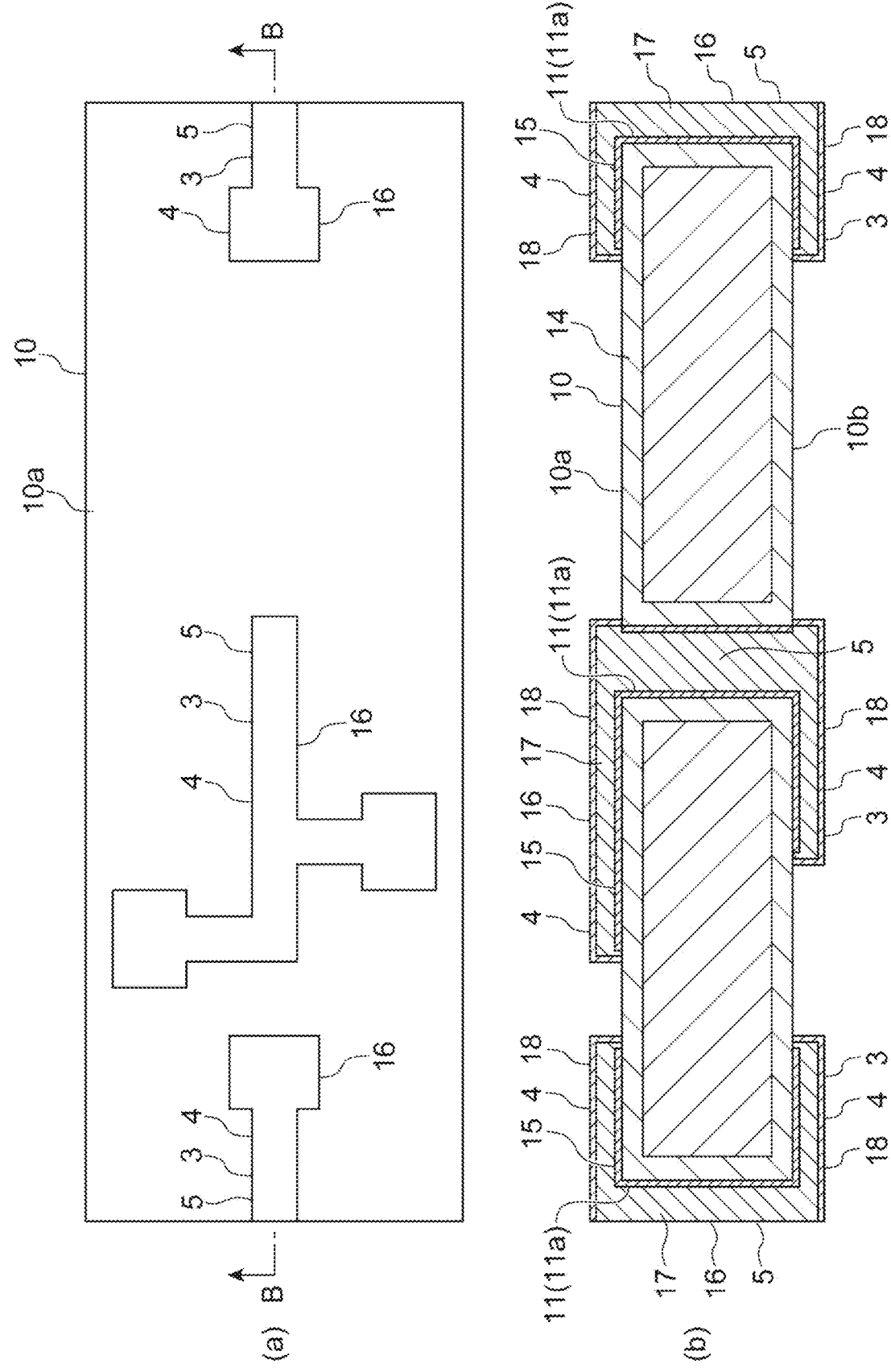
FIGS. 9(a) and 9(b) are views illustrating the method for producing the interposer of FIG. 1.

As illustrated in FIG. 3, a silicon wafer W for obtaining a plurality of interposers 1 by cutting along dicing lines L set in a grid shape is prepared. A portion indicated by a thick line in FIG. 3 is to be an interposer 1. Hereinafter, the method for producing the interposer 1 will be described focusing on the thick-line portion.

First, as illustrated in FIGS. 4(a) and 4(b), a silicon substrate 10 (silicon wafer W) is prepared. Subsequently, as illustrated in FIGS. 5(a) and 5(b), a through hole 11 is formed in the silicon substrate 10 by reactive ion etching or the like. Subsequently, as illustrated in FIGS. 6(a) and 6(b), by performing thermal oxidation treatment on a surface of the silicon substrate 10, an insulating layer 14 is formed on a first principal surface 10a and a second principal surface 10b of the silicon substrate 10 and an inner surface 11a of the through hole 11 (including an inner surface 12a of a depression 12 after cutting) (first step).

Subsequently, as illustrated in FIGS. 7(a) and 7(b), a boron layer 15 is isotropically formed on the first principal surface 10a and the second principal surface 10b of the silicon substrate 10 and the inner surface 11a of the through hole 11 by CVD epitaxial growth (second step). Subsequently, as illustrated in FIGS. 8(a) and 8(b), the boron layer 15 is patterned along a region R of a wiring pattern 3 by dry etching (second step).

Subsequently, as illustrated in FIGS. 9(a) and 9(b), a metal layer 16 is selectively and isotropically formed on the boron layer 15 by plating (third step). More specifically, a nickel layer 17 is formed on the boron layer 15 by plating, and after that, a gold layer 18 is formed on the nickel layer 17 by plating. Accordingly, the wiring pattern 3 including a surface wiring pattern 4 and a through-wiring pattern 5 is formed. Finally, the silicon wafer W is cut along the dicing lines L to obtain the interposers 1.

As described heretofore, in the method for producing the interposer 1, the boron layer 15 is formed on the insulating layer 14 along the region R for forming the wiring pattern 3, and after that, the metal layer 16 is formed on the boron layer 15 by plating. This configuration is based on the findings that the present inventors have found that the metal layer 16 is selectively and isotropically formed on the boron layer 15 by plating. Therefore, by forming the boron layer 15 accurately by, for example, patterning, the fine wiring pattern 3 can be formed. In addition, in the method for producing the interposer 1, the metal layer 16 is formed on the boron layer 15. This configuration is based on the findings that the present inventors have found that the metal layer 16 is stably formed on the boron layer 15. Therefore, reliability of electrical connection in the wiring pattern 3 can be achieved. Accordingly, in the method for producing the interposer 1, it is possible to achieve both miniaturization of the wiring pattern 3 and reliability of electrical connection in the wiring pattern 3.

In the method for producing the interposer 1, the boron layer 15 is isotropically formed on the insulating layer 14 by CVD epitaxial growth, and after that, the boron layer 15 is patterned along the region R. Therefore, it is possible to accurately and easily form the boron layer 15 along the region R.

In the method for producing the interposer 1, the nickel layer 17 is formed on the boron layer 15 by plating. Because the nickel layer 17 is easily adhered to the boron layer 15, it is possible to reliably and easily form the nickel layer 17 on the boron layer 15.

In the interposer 1, the metal layer 16 is formed on the insulating layer 14 on the inner surface 11a of the through hole 11 with the boron layer 15 interposed therebetween. This configuration is based on the findings that the present inventors have found that the metal layer 16 is stably formed on the boron layer 15. As a result, in the interposer 1, electrical connection in the through-wiring pattern 5 is reliably achieved.

In the interposer 1, the inner surface 11a of the through hole 11 is along the thickness direction D. In a case where the inner surface 11a is along the thickness direction D, it is difficult to form the metal layer 16 on the inner surface 11a by, for example, a vapor deposition such as evaporation. Because the metal layer 16 is formed on the insulating layer 14 on the inner surface 11a with the boron layer 15 interposed therebetween, even in such a case, the metal layer 16 is stably formed on the inner surface 11a, and electrical connection in the through-wiring pattern 5 is reliably achieved.

In the interposer 1, the inner surface 11a of the through hole 11 is along a direction intersecting the thickness direction D. In a case where the inner surface 11a is along a direction intersecting the thickness direction D, it is difficult to form the metal layer 16 on the inner surface 11a by, for example, a vapor deposition such as evaporation. Because the metal layer 16 is formed on the insulating layer 14 on the inner surface 11a with the boron layer 15 interposed therebetween, even in such a case, the metal layer 16 is stably formed on the inner surface 11a, and electrical connection in the through-wiring pattern 5 is reliably achieved.

In the interposer 1, the width of the through hole 11 is 10 μm or more and 100 μm or less. Because the metal layer 16 is formed on the insulating layer 14 on the inner surface 11a of the through hole 11 with the boron layer 15 interposed therebetween, even in such a fine through hole 11, the metal layer 16 is formed on the inner surface 11a of the through hole 11, and electrical connection in the through-wiring pattern 5 is reliably achieved.

In the interposer 1, the metal layer 16 is a plating layer. This configuration is based on the findings that the present inventors have found that the metal layer 16 is selectively and isotropically formed on the boron layer 15 by plating. As a result, by forming the boron layer 15 on the insulating layer 14 on the inner surface 11a of the through hole 11, it is possible to reliably form the metal layer 16 on the insulating layer 14 on the inner surface 11a of the through hole 11 with the boron layer 15 interposed therebetween without depending on the shape of the through hole 11 or the like. Therefore, electrical connection in the through-wiring pattern 5 is more reliably achieved.

In the interposer 1, the silicon substrate 10 constitutes the interposer 1. Therefore, it is possible to obtain the interposer 1 in which electrical connection in the through-wiring pattern 5 is reliably achieved.

In a case where the metal layer 16 is formed on the insulating layer 14 by using, for example, a vapor deposition such as evaporation or sputtering, in order to facilitate formation of the metal layer 16 on the insulating layer 14, it is necessary to form the inner surface 11a of the through hole 11 in, for example, a tapered shape or the like. On the contrary, in the method for producing the interposer 1, because the metal layer 16 can be selectively and isotropically formed on the boron layer 15 by plating, even in a case where the inner surface 11a is along the thickness direction D, it is possible to stably form the metal layer 16 on the inner surface 11a. As a result, it is not necessary to form the inner surface 11a in a tapered shape, and it is possible to easily produce the interposer 1 having the finer through-wiring pattern 5.

Heretofore, although one embodiment of the present disclosure has been described above, one embodiment of the present disclosure is not limited to the above-described one embodiment. For example, in the above-described embodiment, although the insulating layer 14 is a silicon oxide film formed by performing thermal oxidation treatment on the surface of the silicon substrate 10, the insulating layer may be stacked on the surface of the silicon substrate 10. The insulating layer 14 may be formed on the surface of the silicon substrate 10 including the inner surface 11a of the through hole 11 along at least the wiring pattern 3 (region R). The insulating layer 14 may be formed only in the region along the wiring pattern 3.

The metal layer 16 may not be embedded in the through hole 11 and may be provided on the boron layer 15 on the inner surface 11a of the through hole 11 so that a gap is formed in the through hole 11. For example, the metal layer 16 may be provided so as to form a gap that is opened to the first principal surface 10a side and the second principal surface 10b side of the silicon substrate 10 in the through hole 11.

In the above-described embodiment, the silicon substrate 10 constitutes the interposer 1. However, the silicon substrate 10 may constitute a semiconductor device (for example, an optical semiconductor element such as an image sensor). In this case, the through-wiring pattern 5 electrically connects, for example, an electrode which is the surface wiring pattern 4 on the first principal surface 10a side and a mounting pad which is the surface wiring pattern 4 on the second principal surface 10b side. In the case of application to an image sensor, from the viewpoint of suppressing a dark current, it is preferable that the boron layer 15 is disposed in the vicinity of a light receiving portion. In a case where the silicon substrate 10 constitutes a semiconductor device, it is preferable that the metal layer 16 is formed by electroless metal plating in order to avoid electric breakdown.

In the above-described embodiment, the through hole 11 is provided in the silicon substrate 10, and the through-wiring pattern 5 is included in the wiring pattern 3. However, the through hole 11 may not be provided, and the through-wiring pattern 5 may not be included in the wiring pattern 3. Irregularities may be provided on the surface of the silicon substrate 10, and the wiring pattern 3 may be provided along the irregularities. In the method for producing the interposer 1 according to the embodiment, because the boron layer 15 is isotropically formed by a vapor deposition, even in a case where there are irregularities or the like in the region R, it is possible to reliably form the boron layer 15 along the region R.

REFERENCE SIGNS LIST

1: interposer (wiring structural body), 3: wiring pattern, 10: silicon substrate, 14: insulating layer, 15: boron layer, 16: metal layer, R: region for forming wiring pattern.

The invention claimed is:
1. A method for producing a wiring structural body provided with a wiring pattern, comprising:
    forming an insulating layer on a surface of a silicon substrate along at least a region for forming the wiring pattern;
    forming a boron layer consisting of boron directly on the insulating layer along the region; and
    forming a metal layer on the boron layer by plating.
2. The method for producing the wiring structural body according to claim 1, wherein, in forming the boron layer, the boron layer is isotropically formed on the insulating layer by a vapor deposition, and after that, the boron layer is patterned along the region.
3. The method for producing the wiring structural body according to claim 1, wherein in forming the metal layer, a nickel layer is formed on the boron layer by plating.
4. The method for producing the wiring structural body according to claim 1, wherein the insulating layer is a silicon oxide film formed by performing thermal oxidation treatment on the surface of the silicon substrate.

\* \* \* \* \*